(12) United States Patent
Lee

(10) Patent No.: US 8,788,247 B2
(45) Date of Patent: Jul. 22, 2014

(54) SYSTEM AND METHOD FOR ANALYZING EFFECTIVENESS OF DISTRIBUTING EMERGENCY SUPPLIES IN THE EVENT OF DISASTERS

(75) Inventor: Young Min Lee, Old Westbury, NY (US)

(73) Assignee: International Business Machines Corporation, Armonk, NY (US)

( * ) Notice: Subject to any disclaimer, the term of this patent is extended or adjusted under 35 U.S.C. 154(b) by 810 days.

(21) Appl. No.: 12/194,993

(22) Filed: Aug. 20, 2008

(65) Prior Publication Data

US 2010/0049485 A1 Feb. 25, 2010

(51) Int. Cl.
| | |
|---|---|
| *G06F 17/10* | (2006.01) |
| *G06F 7/48* | (2006.01) |
| *G06Q 10/00* | (2012.01) |
| *G06F 17/50* | (2006.01) |
| *G06Q 10/08* | (2012.01) |
| *G06N 7/00* | (2006.01) |

(52) U.S. Cl.
CPC ............ *G06F 17/5009* (2013.01); *G06Q 10/08* (2013.01); *G06N 7/005* (2013.01)
USPC .................. 703/6; 703/2; 705/7.12; 705/7.37

(58) Field of Classification Search
CPC ..... G06F 17/5009; G06Q 10/08; G06N 7/005
USPC ........... 703/2, 3, 6; 705/7.12, 332, 338, 8, 28, 705/7.37; 701/204, 201; 706/13, 46, 47, 62
See application file for complete search history.

(56) References Cited

U.S. PATENT DOCUMENTS

| | | | | |
|---|---|---|---|---|
| 5,689,233 | A * | 11/1997 | Kurisu et al. ................. | 340/506 |
| 6,169,476 | B1 * | 1/2001 | Flanagan ................. | 340/286.02 |
| 6,558,164 | B2 * | 5/2003 | Raha ............................... | 434/62 |
| 6,587,780 | B2 * | 7/2003 | Trovato ......................... | 701/117 |
| 7,053,772 | B2 * | 5/2006 | Wagner et al. ............ | 340/539.17 |
| 7,257,552 | B1 * | 8/2007 | Franco ........................... | 705/28 |
| 7,483,917 | B2 * | 1/2009 | Sullivan et al. ........ | 707/999.007 |
| 7,542,884 | B2 * | 6/2009 | Boris et al. ........................ | 703/2 |

(Continued)

OTHER PUBLICATIONS

Lisa Patvivatsiri, Elliot J. Montes, Jr., and Ouyang Xi. 2007. Modeling bioterrorism preparedness with simulation in rural healthcare system. In Proceedings of the 39th conference on Winter simulation (WSC '07). IEEE Press, Piscataway, NJ, USA, pp. 1155-1160.*

(Continued)

*Primary Examiner* — Akash Saxena
(74) *Attorney, Agent, or Firm* — Scully, Scott, Murphy & Presser, P.C.; Daniel P. Morris, Esq.

(57) ABSTRACT

A computer-implemented method and system in one embodiment estimate the effectiveness of a dispensing plan of emergency supplies during disasters or in like scenarios, by simulating a flow of emergency supplies in a multi-echelon supply chain, dynamics of victims and progression of disaster. The performance metrics estimated in one embodiment include, but not limited to, overall coverage of distribution, inventory of supplies (e.g., shortage and surplus) and utilization of resources (e.g., shortage and surplus).

20 Claims, 5 Drawing Sheets

(56) References Cited

U.S. PATENT DOCUMENTS

| | | | |
|---|---|---|---|
| 7,644,005 B1* | 1/2010 | Billiotte et al. | 705/7.22 |
| 7,898,458 B2* | 3/2011 | Shibayama et al. | 342/25 A |
| 8,378,843 B2* | 2/2013 | Mackenzie et al. | 340/870.01 |
| 2002/0138352 A1* | 9/2002 | DeMaggio | 705/28 |
| 2002/0156642 A1* | 10/2002 | Aida | 705/1 |
| 2003/0014286 A1* | 1/2003 | Cappellini | 705/5 |
| 2004/0158507 A1* | 8/2004 | Meek et al. | 705/28 |
| 2004/0199445 A1* | 10/2004 | Eder | 705/35 |
| 2004/0243299 A1* | 12/2004 | Scaer et al. | 701/200 |
| 2004/0249679 A1* | 12/2004 | Henderson et al. | 703/6 |
| 2005/0004823 A1* | 1/2005 | Hnatio | 705/7 |
| 2005/0027571 A1* | 2/2005 | Gamarnik et al. | 705/4 |
| 2005/0038685 A1* | 2/2005 | Collins | 705/8 |
| 2005/0075951 A1* | 4/2005 | Zieger | 705/28 |
| 2005/0119919 A1* | 6/2005 | Eder | 705/4 |
| 2005/0119949 A1* | 6/2005 | Campagna | 705/28 |
| 2005/0149366 A1* | 7/2005 | Wagner et al. | 705/7 |
| 2005/0209997 A1* | 9/2005 | Haas et al. | 707/1 |
| 2006/0168592 A1* | 7/2006 | Andrews et al. | 719/318 |
| 2007/0159355 A1* | 7/2007 | Kelly et al. | 340/905 |
| 2007/0288208 A1* | 12/2007 | Grigsby et al. | 703/2 |
| 2007/0297589 A1* | 12/2007 | Greischar et al. | 379/201.01 |
| 2008/0065576 A1* | 3/2008 | Friedlander et al. | 706/47 |
| 2008/0140495 A1* | 6/2008 | Bhamidipaty et al. | 705/9 |
| 2008/0172262 A1* | 7/2008 | An et al. | 705/7 |
| 2008/0172352 A1* | 7/2008 | Friedlander et al. | 706/46 |
| 2008/0177688 A1* | 7/2008 | Friedlander et al. | 706/46 |
| 2008/0215512 A1* | 9/2008 | Narzisi et al. | 706/13 |
| 2009/0106068 A1* | 4/2009 | Bhamidipaty et al. | 705/8 |
| 2009/0144121 A1* | 6/2009 | Chevis et al. | 705/9 |
| 2009/0287967 A1* | 11/2009 | Winokur | 714/54 |
| 2009/0299766 A1* | 12/2009 | Friedlander et al. | 705/3 |
| 2010/0049485 A1* | 2/2010 | Lee | 703/6 |
| 2011/0040595 A1* | 2/2011 | Chou et al. | 705/8 |
| 2011/0087514 A1* | 4/2011 | Ettl et al. | 703/2 |
| 2011/0178945 A1* | 7/2011 | Hirai | 705/338 |

OTHER PUBLICATIONS

Deniz Özdemir et al, Multi-Location Transshipment Problem With Capacitated Production and Lost Sales, In Proceedings of the 2006 Winter Simulation Conference, IEEE 2006, pp. 1470-1476.*

An emergency logistics distribution approach for quick response to urgent relief demand in disasters; Jiuh-Biing Sheu; Transportation Research Part E 43 (2007) pp. 687-709.*

Whitworth, Mark H., Designing the Response to an Anthrax Attack, Interfaces, Nov.-Dec. 2006, pp. 562-568, vol. 36, No. 6.

Richter, Anke et al., Preliminary Analysis of Alternate Modes of Dispensing for LA County, Informs International Conference 2007, 2007, unpublished.

Aaby, Kay et al., Montgomery County's Public Health Service Uses Operations Research to Plan Emergency Mass Dispensing and Vaccination Clinics, Interfaces, Nov.-Dec. 2006, pp. 569-579, vol. 36, No. 6.

Agency for Healthcare Research and Quality, Bioterrorism and Other Public Health Emergencies: Tools and Models for Planning and Preparedness: Community-Based Mass Prophylaxis: A planning Guide for Public Health Preparedness, Aug. 2004, http://www.ahrq.gov/research/cbmprophyl/cbmpro.htm#down.

Center for Disease Control and Prevention, Smallpox Response Plan and Guidelines, 2001, Version 3.0, http://www.bt.cdc.gov/agent/smallpox/response-plan/index.asp.

Lee, Eva K. et. al., Large-Scale Dispensing for Emergency Response to Bioterrorism and Infectious-Disease Outbreak, Interfaces, Nov.-Dec. 2006, pp. 591-607, vol. 36, No. 6.

Miller, George et al., Responding to Bioterrorist Smallpox in San Antonio, Interfaces, Nov.-Dec. 2006, pp. 580-590, vol. 36, No. 6.

Boulton, M. L. et al., Brief Report: Terrorism and Emergency Preparedness in State and Territorial Public Health Departments—United States, 2004.

Lee, Eva K., In Case of Emergency, OR/MS Today, Feb. 2008, pp. 28-34, 35(1).

* cited by examiner

SYSTEM AND METHOD FOR ANALYZING EFFECTIVENESS OF DISTRIBUTING EMERGENCY SUPPLIES IN THE EVENT OF DISASTERS

FIELD OF THE INVENTION

The present disclosure relates generally to computer-implemented simulation models, and more particularly to analyzing effectiveness of distributing emergency supplies in the event of disasters.

BACKGROUND OF THE INVENTION

When disasters occur (e.g., hurricane, earthquake, fire, bioterrorism, and like), emergency supplies (e.g., water, meal, medicine, generators, blankets, tarps, and like) need to be distributed to the population or victims within a short period of time, for example, within a few days. Distribution operation (e.g., supply chain and dispensing) in such emergency scenarios present a unique problem because the operation needs to cover a large number of people (e.g., millions of victims) in a short period of time (e.g., 48-72 hours), and disaster is a one-time event with no opportunity for re-planning the distribution operations.

Disastrous events bring undesirable conditions for supply chain operation. For instance, to prepare for the event of bioterrorism in which contagious disease such as anthrax, plague, small-pox, or tularemia can be spread to the general public, a plan for dispensing medical supplies such as vaccines and antibiotics to the public needs to be put in place. The mass prophylaxis would need to cover millions of people in large cities in a short amount of time. The health and lives of many people depend on the precision and effectiveness of the distribution and dispensing plan of medical supplies. No time is available to correct or adjust the plan once the emergency event occurs. Similarly, in the event of natural disasters such as hurricane, earthquake, tornado, flood, tsunami, or like, the needed supplies and resources (such as water, meal, ice and tarp) should be dispensed quickly, ideally within three days, to the affected area and population.

In a wide-spread smallpox attack, the vaccination of all potential contact should take place within four days of exposure, and, in the event of an anthrax outbreak, the distribution of antibiotics should take place within two days of the event. A plan of dispensing and vaccinating should consider various risk factors and uncertainties. In the event of hurricane damage, the victims in the affected area should be provided with water, ice, meal, tarp, cots, blankets and generators within three days to protect general health.

Distribution of emergency supplies involves a multi-echelon supply chain: from one or more vendors to one or more distribution centers ("DC") to one or more staging areas and others and finally to one or more points of dispensing, also known as point of distribution ("POD"). The owners of the emergency supplies at different levels of the multi-echelon supply chain vary. For example, supplies may be owned by the federal government, local governments, private suppliers, or logistic providers at different supply chain levels. Distribution of emergency supplies also involves distribution/dispensing of supply to the victims at PODs.

Government agencies such as the Federal Emergency Management Agency ("FEMA"), Centers for Disease Control and Prevention ("CDC"), state and local governments, vendors and 3PLs ($3^{rd}$ party logistics service provider) may have distribution plans. For example, when a hurricane occurs, a federal agency may ship medical and other emergency supplies to one or more of designated receiving, storing and staging (RSS) warehouses for each city or county in a predetermined number of hours. Then, it is the responsibility of each city or county that has a POD plan to transport the supplies to each POD and dispense them to the general public.

A tool that estimates the effectiveness of a distribution plan and/or how differently the plan would work in a variety of situations and scenarios would be desirable: for example, how fast the plan can reach disaster victims and cover the affected area, the adequate supply quantity to be distributed, the level of resources such as transportation equipment and machinery, loading/unloading facilities, dispensing personnel, etc., that is required. A simulation model would help offices and personnel involved in disaster management to evaluate the effectiveness of alternative dispensing plans and identifying opportunities for improvement. Currently, no known technology simultaneously simulates multi-echelon supply chain, progression of disease, and dynamics of victim at PODs, and interactions among them to analyze the effectiveness of distributing emergency supplies in the event of disaster.

BRIEF SUMMARY OF THE INVENTION

A method and system for estimating effectiveness of a distribution or dispensing plan of emergency supplies during disaster events are provided. The method, in one aspect, may comprise simulating a flow of emergency supplies, simulating dynamics of victims, and simulating progression of disaster, and interactions among them.

A system for estimating effectiveness of a distribution and dispensing plan of emergency supplies during disaster events, in one aspect, may comprise a flow of emergency supplies simulator module operable to simulate a flow of emergency supplies, a dynamics of victims simulator module operable to simulate dynamics of victims and a progression of disaster simulator module operable to simulate progression of disaster.

A program storage device readable by a machine, tangibly embodying a program of instructions executable by the machine to perform described methods of estimating effectiveness of a dispensing plan of emergency supplies during disaster events may be also provided.

Further features as well as the structure and operation of various embodiments are described in detail below with reference to the accompanying drawings. In the drawings, like reference numbers indicate identical or functionally similar elements.

DETAILED DESCRIPTION

Figure 1:
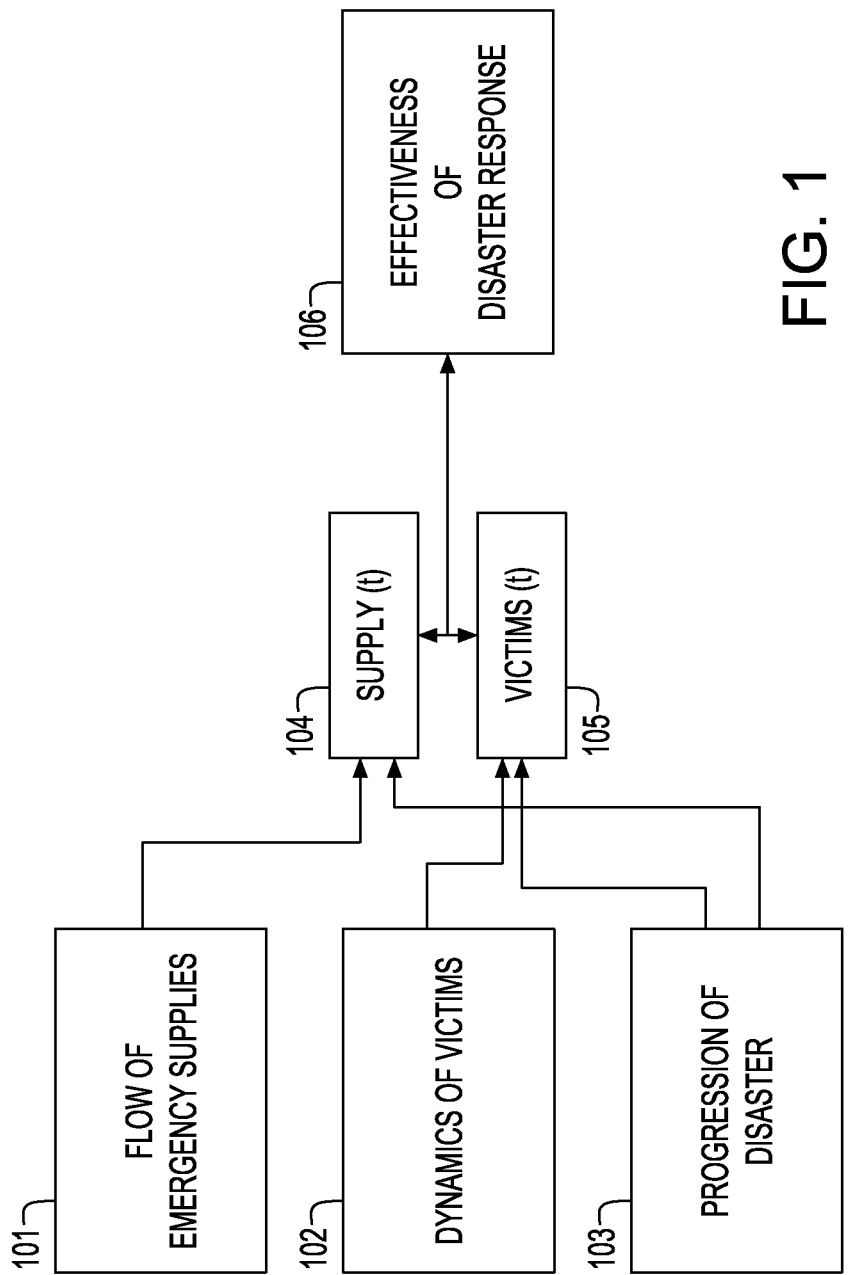
FIG. 1 shows an overview of a simulation model of the present disclosure in one embodiment.

A computer-implemented method and system in one embodiment estimate the effectiveness of a dispensing plan of emergency supplies during disasters or in like or other scenarios, by simulating a flow of emergency supplies in a multi-echelon supply chain, dynamics of victims and progression of disaster, and simulating interactions among them. The interactions may be dynamic. For example, as the flow of emergency supplies is simulated, the information or data from that simulation is used to simulate the dynamics of victims and vice verse. Similarly, for example, as the progression of disaster is simulated the data from the simulated progression of disaster is used to simulate the dynamics of victims and the flow of emergency supplies. The performance metrics estimated in one embodiment include, but not limited to, overall coverage of distribution, inventory of supplies (shortage and surplus) and utilization of resources (shortage and surplus). The simulation of those models or events, and their interactions, can predict the outcome or result of a distribution plan and its effectiveness.

In one aspect, estimating performance of emergency distribution plan for disasters considers supply chain of emergency supplies, dispensing operations, progression of disasters, behavior of victims and other stochastic factors or parameters such as road conditions, availability of truck, availability of volunteer, availability of information and availability of infrastructure such as electricity.

In one embodiment, simulating the flow of emergency supplies may include considering a flow of the supplies from one or more sources (e.g., vendor) to various points in the supply chain then to one or more points of distribution, for instance. For instance, supplies may flow from a vendor to a distribution center (DC), staging areas, then to a point of distribution (POD). At each level or point of the flow, the following factors (but not limited to those) may be considered and simulated: pre-stocked supply quantity; availability of fleet (e.g., transportation medium such as trucks); transportation routes and time; road conditions; loading and/or unloading time and resource; activation of the site (e.g., site becoming an active operational stage); re-stocking policies (replenishment and cross-shipping), whether push or pull replenishment. Push replenishment refers to supply being sent top-down (e.g., from vendors, DCs, to staging areas, and to PODs) based on one or more sender's criteria. Pull replenishment refers to supply being requested bottom-up (e.g., PODs requesting staging areas, staging areas requesting DCs and DCs requesting vendors) based on one or more receiver's criteria.

In one embodiment, simulating the dynamics of victims may include considering the number of victims, arrival pattern and/or surge of victims at PODs, level of patience for waiting on line, dispensing speed, POD activation, switching of PODs for victims. Progression of disaster may be simulated considering the following factors: severity of disaster, trajectory of disaster, speed and/or duration of the disaster, affected number of victims, and influence on road conditions (transportation).

FIG. 1 shows an overview of a simulation model of the present disclosure in one embodiment. The model shown in FIG. 1 comprises three components: flow of emergency supplies (101), dynamics of victims (102) and progression of disaster (103). Each component interacts with other components, e.g., by updating and retrieving common data elements, e.g., Supply (t), which represents supply quantity in various locations over time, and Victims(t), which represents number of victims in various POD locations over time. The flow of emergency supplies (101) influences the availability of supply at various location and time (t), i.e., Supply(t) (104). For example, if water supply flows relatively fast from a vendor to DC to Staging Areas and POD, then the availability of the supply at POD will increase that much fast. Detailed description of simulating the flow of emergency supplies is described below in FIG. 2. The dynamics of victims (102) influence the number of victims at various PODs at various time (t), i.e., Victims(t) (105). For example, an anthrax attack would alarm a large number of people causing many people to come to POD location very fast to pick up antibiotics. The progression of disaster (103) influences not only Supply(t) (104) but also Victims(t) (105). For example, a severe hurricane would damage some roads causing slow transportation of supply, and it would also create many victims fast, Victims (t) (105). The effectiveness of disaster response (106) depends on the balance of the Supply(t) and Victims(t). For example, if enough supply is available for all the victims at the right place and the right time, the effectiveness of the response plan would be great. However, if many victims arrive at a POD, but the supply arrives late there, the effectiveness would be less than desirable. Therefore, simulation of interactions of such components, flow of emergency supplies (101), dynamics of victims (102) and progression of disaster (103), provides a useful and novel way of evaluating the effectiveness of a disaster response plan. The components of simulation model can be built using discrete-event simulation method, wherein various events are modeled in discrete ways by simulation timer and distribution functions, or using continuous simulation (e.g., system dynamics model), wherein various events are modeled by differential equations and interaction among model variables are described by algebraic expressions.

Figure 2:
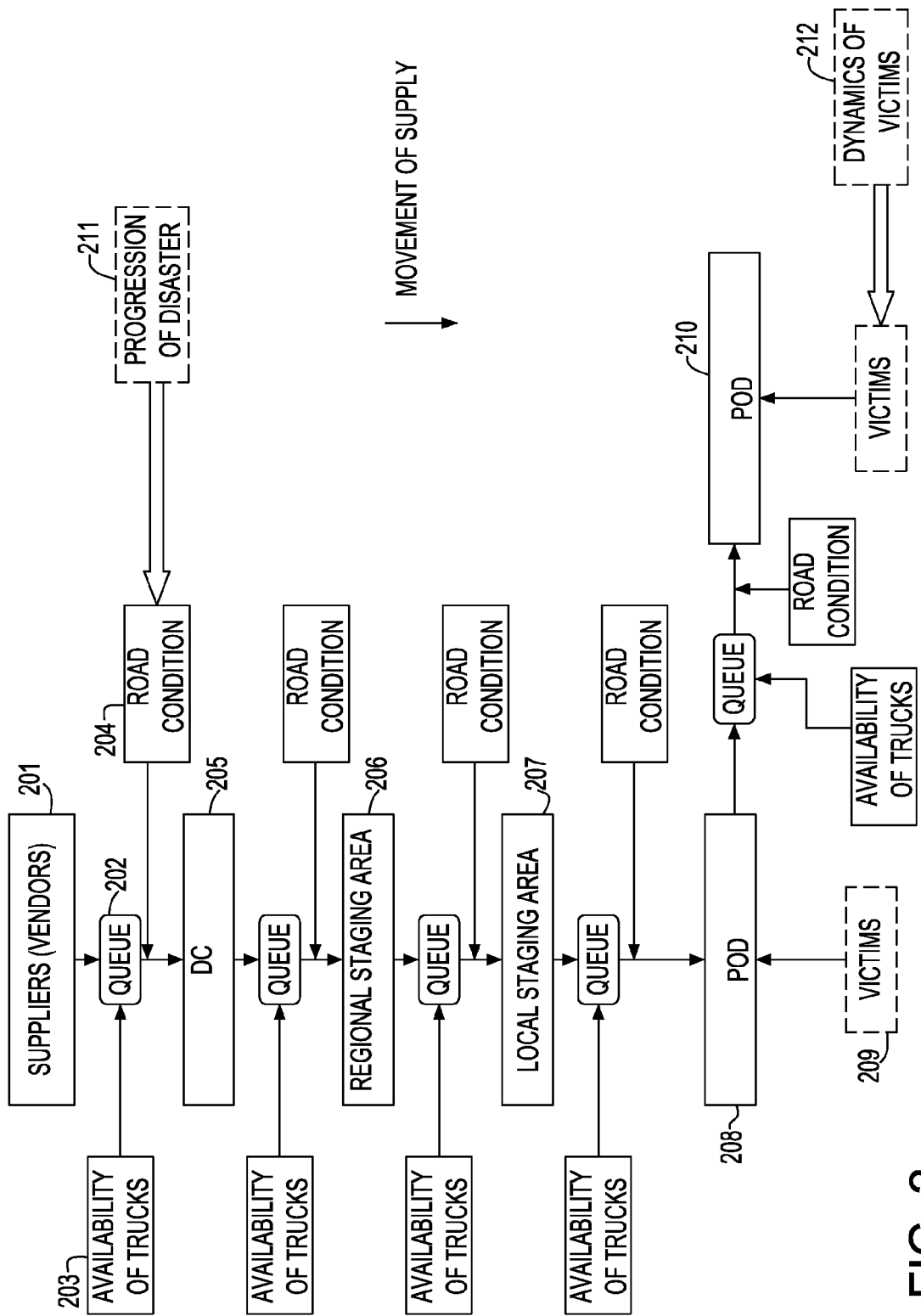
FIG. 2 is a flow diagram illustrating simulation of emergency supplies in one embodiment of the present disclosure.

FIG. 2 is a flow diagram illustrating simulation of emergency supplies in one embodiment of the present disclosure. The emergency supplies in one embodiment flow from one or more vendors (201) to one or more DCs (205) to one or more regional staging areas (e.g., owned by federal government agencies such as FEMA or CDC) (206), to one or more local staging areas (e.g., owned by city or state government agencies) (207) and to PODs (208) and to other PODs (210). The flow of supply from one node (e.g., Vendor 201) to another node (e.g., DC 205) requires availability of transportation medium such as trucks (203). In modeling with discrete-event simulation method, the material flow from the vendor can be triggered by a simulation timer or by other event, such as an event of disaster landing in an area. The supply would queue (202) until a transportation medium (e.g., truck) is available to transport the supply. Then, the supply would be transported through one or more roadways. The time taken for the truck to move from one node to another is dependent on the distance and speed of a truck. The roadways can be damaged by the progression of disaster (211), and road condition (204) would affect the speed of a truck. The simulation model of the Progression of Disaster (211) interacts with the simulation model of the Flow of Emergency Supplies (101) by changing the information (e.g., road conditions) used by the model of the Flow of Emergency Supplies (101). The simulation model of the Progression of Disaster (211) may change the information dynamically as the disaster progression is simulated. Various numbers of Victims (209) of disaster would arrive at a POD (208) at various times to collect quantities of supply. Victims may wait for a predetermined duration, and may switch to another POD (e.g., from a POD 108 to another POD 210) if the wait is too long. The behavior of victims (212) would influence how victims would behave. The simulation model of the Dynamics of Victims (212) interacts with simulation model of the Flow of Emergency Supplies (101) by changing the information (i.e., number of victims needing supplies) that are used by the model of the Flow of Emergency Supplies (101). The simulation model of the Dynamics of Victims (212) may change the information dynamically as the dynamics of victims is simulated. Details of simulation of progression of disaster are described below in FIG. 3. Details of simulation of dynamics of victims are described below in FIG. 4.

Figure 3:
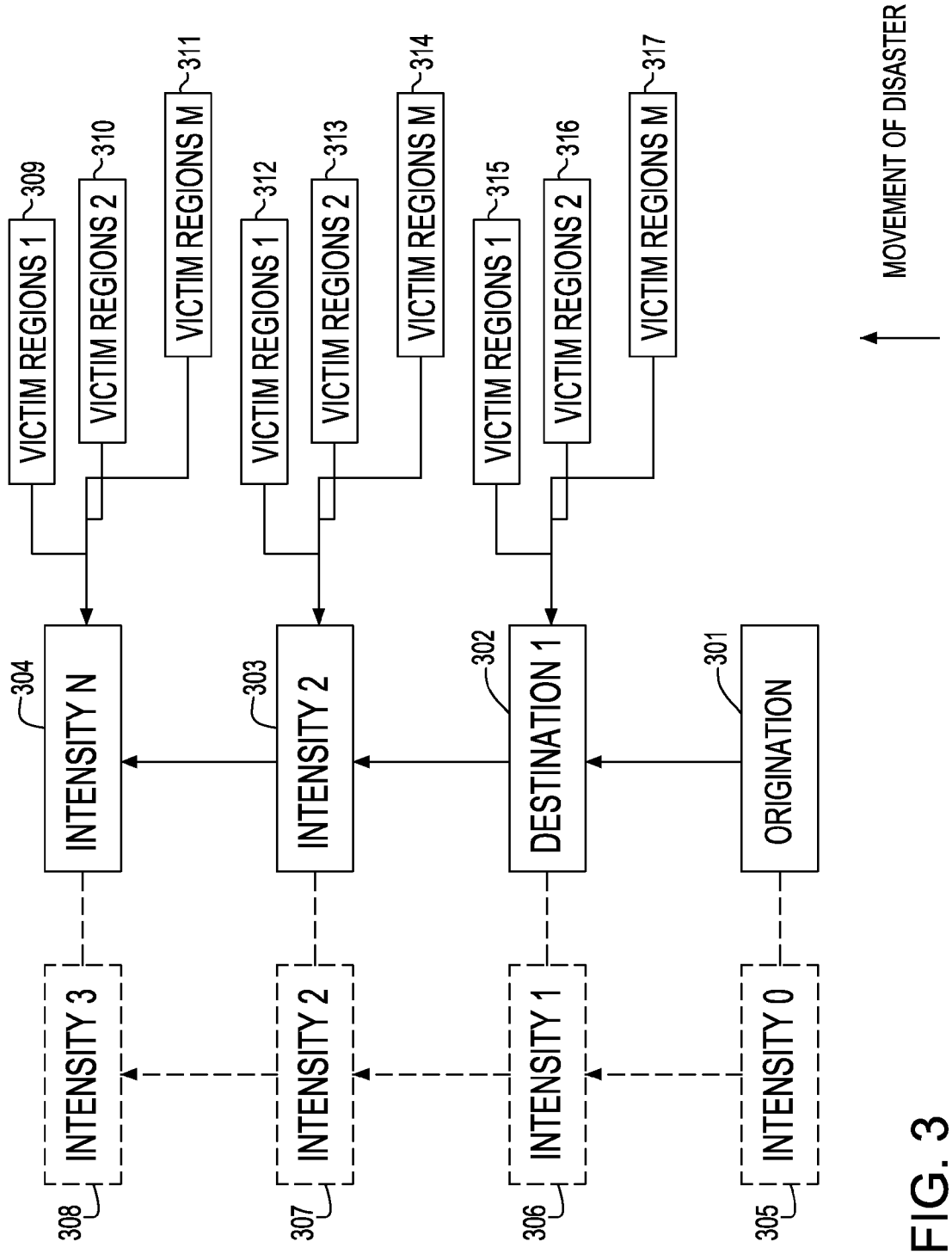
FIG. 3 is a flow diagram illustrating simulation of progression of disaster in one embodiment of the present disclosure.

FIG. 3 is a flow diagram illustrating simulation of progression of disaster in one embodiment of the present disclosure. A disaster (e.g., hurricane) moving from an origination point (301) (e.g., landfall area) to various locations based on the trajectory of the storm, e.g., to destination 1 (302), destination 2 (303), destination 3 (303) and to destination N (304) is simulated. As the disaster moves the intensity can also change, and therefore, the change in intensity may be simulated. For example, the origination may have intensity 0 (305) and the intensity may change to intensity 1 (306), intensity 2 (307) and intensity 3 (308) as the disaster moves through the destinations (302, 303, 304 respectively). The disaster moves from a location to another in a speed that may be constant or changing overt time. The movement and intensity change of disaster in one embodiment can be modeled by discrete-event simulation method or continuous simulation method described earlier. As the disaster moves into a town or city (i.e., destination), the disaster produces a number of victims. Depending on the how close various regions are located with respect to the disaster in destination location, a region may produce more victims than another region. There may be a number of regions (309, 310, 311, 312, 313, 314, 315, 316, 317) in each affected area, where each area has different number of victims.

Figure 4:
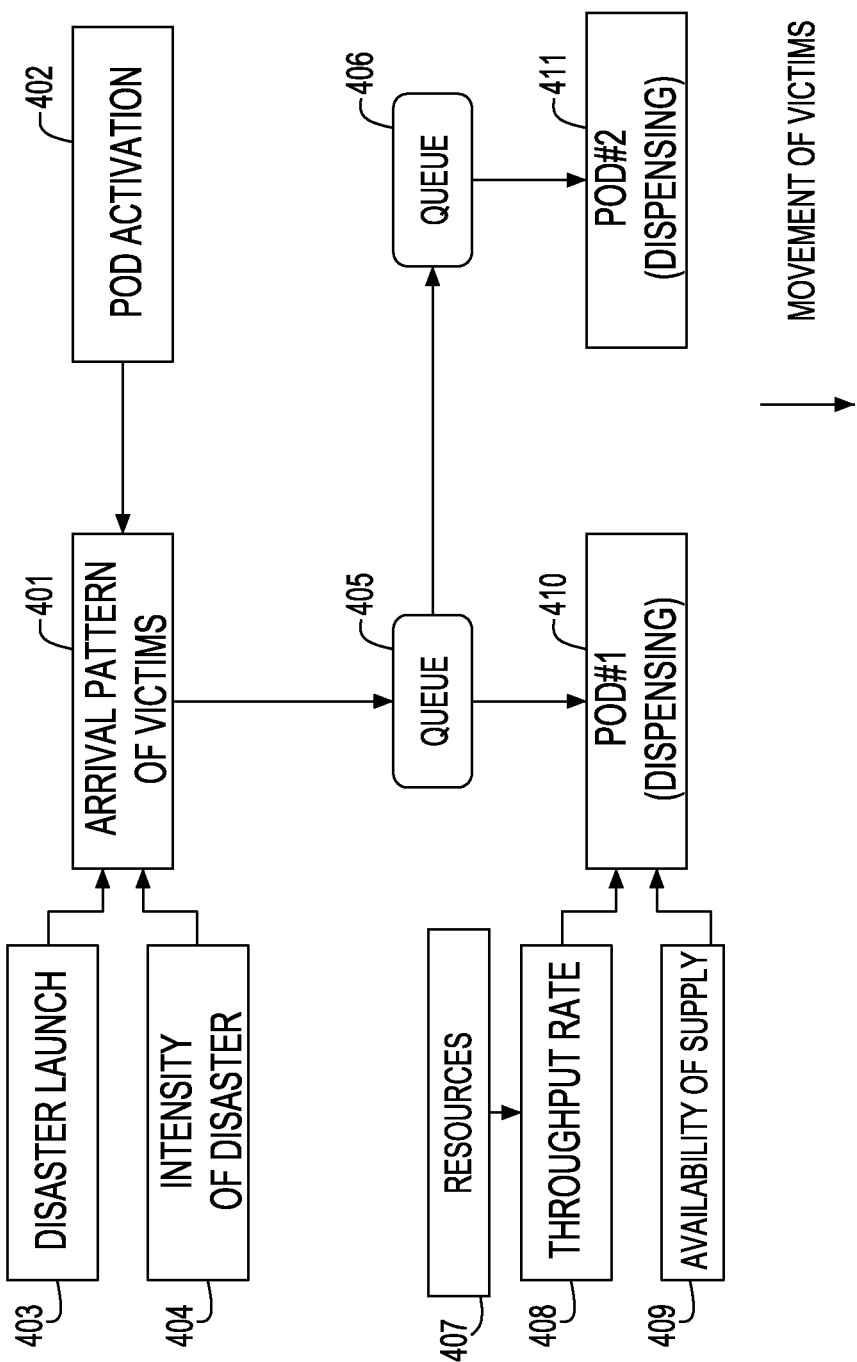
FIG. 4 is a flow diagram illustrating simulation of dynamics of victim in one embodiment of the present disclosure.

FIG. 4 is a flow diagram illustrating simulation of dynamics of victim in one embodiment of the present disclosure. A disaster produces undesirable conditions. Victims of the disaster will come to the point of distribution or dispensing (POD) to receive the emergency supplies such as water, meal and medicine. The dynamics of victim in one embodiment can be modeled using discrete-event simulation method or continuous simulation method or like. The arrival pattern of the victims depends on when a disaster is launched in the area (403), how intense the disaster is (404) and when a POD is activated (e.g., operational) (402). Intensity of Disaster (404) is determined by the model of Progression of Disaster (103 in FIG. 1), e.g., as described with reference to FIG. 3. Thus, the simulation model of the present disclosure in one embodiment provides for interactions between the model of Dynamic of Victims (102) and the model of Progression of Disease (103). The interactions may be dynamic. The arrival pattern may follow a specific probability distribution functions such as Poisson distribution, exponential distribution etc. Victims queue (405) at a POD to receive the supply. The waiting depends on throughput rate (i.e., speed of service), which in turn depends on the resource available at the POD, such as people working, forklift, carts, and size of a POD. The dispensing also depends on the available supply (409). The availability of supply (409) is determined by the model of Flow of Emergency Supplies (101 in FIG. 1), e.g., as described with reference to FIG. 2. Thus, the simulation model of the present disclosure in one embodiment provides for interactions between the model of Dynamics of Victims (102 in FIG. 1) and the model of Flow of Emergency Supplies (101 in FIG. 1). The interactions may be dynamic. A victim may wait in a POD and then switch to another POD (i.e., move from queue 405 to queue 406) if the waiting is too long, e.g., moving from a queue (405) to another queue (406). Each POD can have different dispensing throughput rates and different amount of supply.

The simulation of one or more components of the simulation model of the present disclosure may utilize discrete-even simulation, continuous simulation, or combinations thereof.

Figure 5:
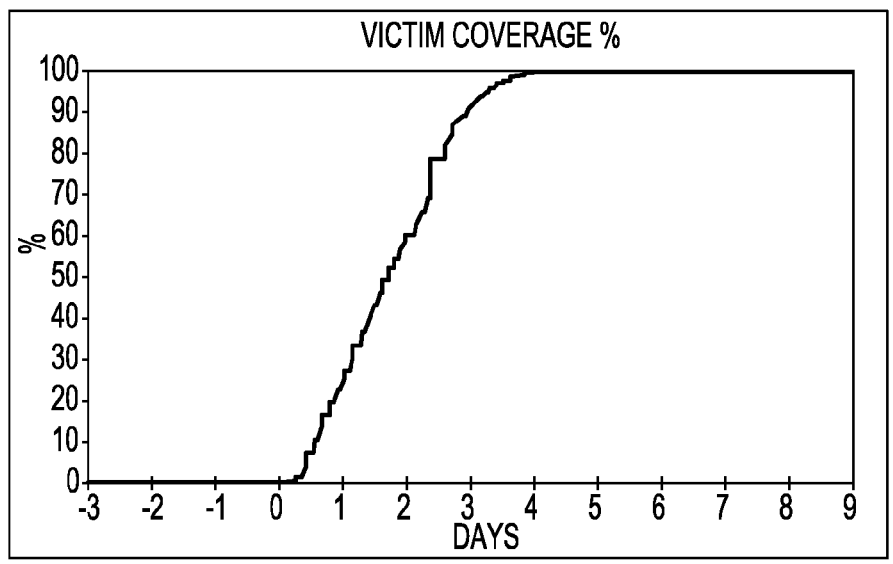
FIG. 5 shows an output from the simulation model of the present disclosure that illustrates the victim coverage changing over time in percentile.
Figure 6:
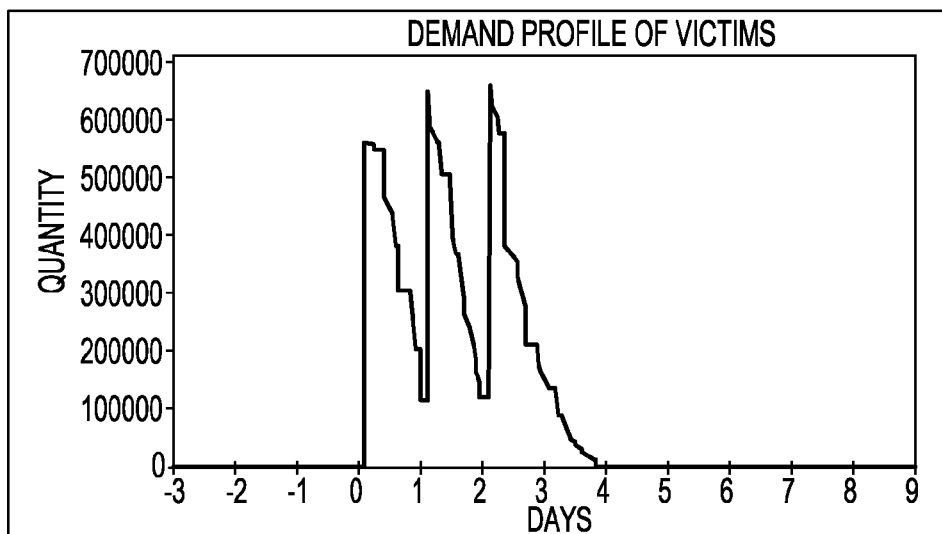
FIG. 6 shows an output from the simulation model of the present disclosure that illustrates the size of demand at a POD location and how fast it is satisfied over time.
Figure 7:
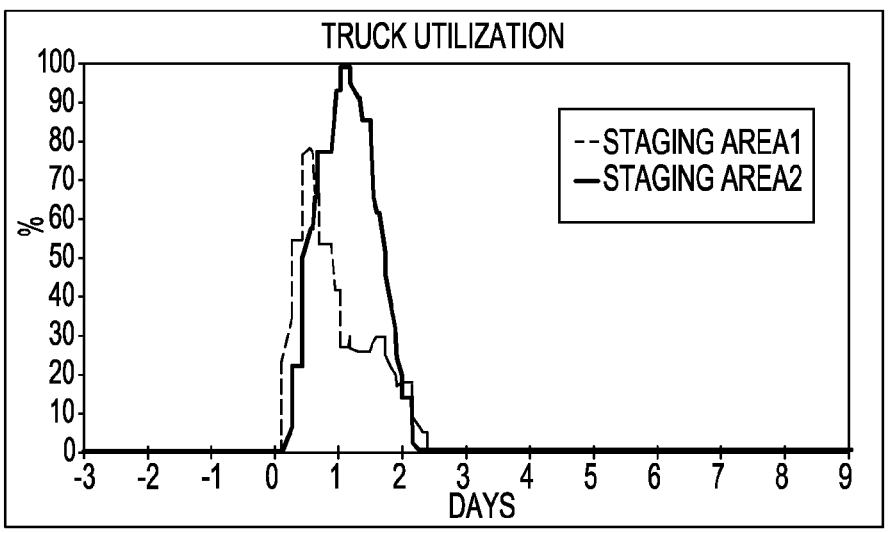
FIG. 7 shows an output from the simulation model of the present disclosure that illustrates the utilization of transportation medium.

FIG. 5, FIG. 6, and FIG. 7 show example outputs from the simulation model of the present disclosure. They help in determining the effectiveness of a disaster response plan. FIG. 5 shows the victim coverage changing over time in percentile. For example, a disaster hits on day=0, and soon after the distribution of emergency starts and the coverage (the percentage) of victims who received the supply starts to go up. FIG. 5 shows that the coverage went up to 55% at day=2 and eventually to 100% at day=4. The slope and height of the curve shows how effective a response plan is.

FIG. 6 shows the size of demand (e.g., number of victims multiplied by supply quantity per each victim) at a POD location and how fast it is satisfied over time. FIG. 6 shows a result from a scenario in which the distribution of supply occurs daily for three straight days. Each day the supply amount is replenished as the supply arrives, and is depleted as the supply is distributed to the victims.

FIG. 7 shows the utilization of transportation medium (e.g., truck) as being a part of the supply chain of the emergency supply. FIG. 7 illustrates the utilization of trucks in two staging areas. For staging area 1, the utilization goes up to about 80% in day=0.5, indicating that there is sufficient number of trucks for this staging area. However, the utilization of the staging area 2 reaches 100% at day=1, indicating that there is a shortage of trucks, which may create a delay of transporting the supply.

Various aspects of the present disclosure may be embodied as a program, software, or computer instructions embodied in a computer or machine usable or readable medium, which causes the computer or machine to perform the steps of the method when executed on the computer, processor, and/or machine.

The system and method of the present disclosure may be implemented and run on a general-purpose computer or special-purpose computer system. The computer system may be any type of known or will be known systems and may typically include a processor, memory device, a storage device, input/output devices, internal buses, and/or a communications interface for communicating with other computer systems in conjunction with communication hardware and software, etc.

The terms "computer system" and "computer network" as may be used in the present application may include a variety of combinations of fixed and/or portable computer hardware, software, peripherals, and storage devices. The computer system may include a plurality of individual components that are networked or otherwise linked to perform collaboratively, or may include one or more stand-alone components. The hardware and software components of the computer system of the present application may include and may be included within fixed and portable devices such as desktop, laptop, server. A module may be a component of a device, software, program, or system that implements some "functionality", which can be embodied as software, hardware, firmware, electronic circuitry, or etc.

The embodiments described above are illustrative examples and it should not be construed that the present invention is limited to these particular embodiments. Thus, various changes and modifications may be effected by one skilled in the art without departing from the spirit or scope of the invention as defined in the appended claims.

I claim:

1. A computer-implemented method for estimating effectiveness of a distribution or dispensing plan of emergency supplies during disaster events, comprising:
    simulating a flow of emergency supplies, including at least a flow of supplies from a source to a plurality of points in a supply chain then to one or more points of distribution, and at each point of the flow, availability of transportation fleet for moving the emergency supplies, transportation route and road conditions;
    simulating dynamics of victims, including an arrival pattern and surge of victims at the one or more points of distribution;
    simulating progression of disaster, including deteriorating of the road conditions; and
    simulating dynamic interactions among the flow of emergency supplies, the dynamics of victims and the progression of disaster,
    wherein the dynamic interactions comprise at least:
        retrieving data associated with when a disaster is launched in an area and how intense the disaster is, updated by the simulating of the progression of disaster, for use by the simulating of the dynamics of victims,
        retrieving data associated with activated point of distribution, updated by the simulating of the flow of emergency supplies, for use by the simulating of the dynamics of victims,
        wherein the simulating of the dynamics of victims is repeated using the retrieved data associated with when a disaster is launched in an area and how intense the disaster is, and the retrieved data associated with the activated point of distribution,
        the further simulated dynamics of the victims comprising movement of at least some the victims from one point of distribution to another point of distribution,
        retrieving data associated with the further simulated dynamics of the victims that is updated by the simulating of the dynamics of victims for use by the simulating of the flow of emergency supplies, wherein the simulating of the flow of emergency supplies is repeated; and
    determining overall effectiveness of a disaster response plan based on the data output from the dynamic interactions,
    wherein the overall effectiveness is determined by at least one of:
    analyzing a percentile of the victims covered over time, produced by the dynamic interactions,
    analyzing a size of demand at the one or more points of distribution and how fast the demand is satisfied over time, produced by the dynamic interactions, and
    analyzing utilization of transportation medium over time, produced by the dynamic interactions,
    wherein said steps of simulating are performed by a computer processor.

2. The method of claim 1, wherein the simulating the flow of emergency supplies comprises, simulating multi-echelon supply chain, pre-stocked supply quantity, availability of fleet, transportation route and time, road conditions, re-stocking policies, or combinations thereof.

3. The method of claim 1, further including simulating replenishment and cross-shipping as re-stocking policies in said simulating a flow of emergency supplies.

4. The method of claim 1, wherein the simulating dynamics of victims comprises simulating number of victims, arrival pattern and surge of victims, distribution and dispensing speed, POD activation, intensity of disaster, switching of point of distributions for victims, or combinations thereof.

5. The method of claim 1, wherein the simulating progression of disaster comprises simulating severity of disaster, trajectory of disaster, speed and duration of disaster, or combinations thereof.

6. The method of claim 1, further including estimating an evolution of one or more performance metrics.

7. The method of claim 6, wherein said one or more performance metrics comprise overall coverage of distribution, inventory of supplies, utilization of resources, demand profiles or combinations thereof.

8. The method of claim 7, wherein the inventory of supplies is measured according to shortage and surplus of emergency supplies.

9. The method of claim 7, wherein the utilization of resources is measured according to shortage and surplus of resources.

10. A system for estimating effectiveness of a distribution and dispensing plan of emergency supplies during disaster events, comprising:
    a computer processor;
    a flow of emergency supplies simulator module executing on the computer processor and operable to simulate a flow of emergency supplies, including at least a flow of supplies from a source to a plurality of points in a supply chain then to one or more points of distribution, and at each point of the flow, availability of transportation fleet for moving the emergency supplies, transportation route and road conditions;
    a dynamics of victims simulator module executing on the computer processor and operable to simulate dynamics of victims, including an arrival pattern and surge of victims at the one or more points of distribution; and
    a progression of disaster simulator module executing on the computer processor and operable to simulate progression of disaster, including deteriorating of the road conditions;
    said flow of emergency supplies simulator module, said dynamics of victims simulator module and said progression of disaster simulator module further operable to dynamically interact with one another
    wherein the dynamically interacting comprise at least:
        retrieving data comprising when a disaster is launched in an area and how intense the disaster is, that is updated by the progression of disaster simulator module for use by the dynamics of victims simulator module,
        retrieving data comprising an activated point of distribution that is updated by the flow of emergency supplies simulator module for use by the dynamics of victims simulator module,
        wherein the dynamics of victims simulator module further simulates the dynamics of the victims based on the retrieved data comprising when a disaster is launched in an area and how intense the disaster is, and the retrieved data associated with the activated point of distribution,
        the further simulated dynamics of the victims comprising movement of at least some the victims from one point of distribution to another point of distribution,
        retrieving data associated with the further simulated dynamics of the victims that is updated by the dynamics of victims simulator module for use by the flow of emergency supplies simulator module, wherein the flow of emergency supplies simulator module further simulates the flow of emergency supplies; and wherein overall effectiveness of a disaster response plan is determined based on the data output from the dynamic interactions, wherein the overall effectiveness is determined by at least one of:

analyzing a percentile of the victims covered over time, produced by the dynamically interacting, analyzing a size of demand at the one or more points of distribution and how fast the demand is satisfied over time, produced by the dynamically interacting, and analyzing utilization of transportation medium over time, produced by the dynamically interacting.

11. The system of claim 10, wherein the flow of emergency supplies simulator module simulates multi-echelon supply chain, pre-stocked supply quantity, availability of fleet, transportation route and time, road conditions, re-stocking policies, or combinations thereof.

12. The system of claim 10, wherein the flow of emergency supplies simulator module simulates replenishment and cross-shipping as re-stocking policies.

13. The system of claim 10, wherein the dynamics of victims simulator module simulates number of victims, arrival pattern and surge of victims, distribution and dispensing speed, POD activation, intensity of disaster, switching of PODs for victims, or combinations thereof.

14. The system of claim 10, wherein the progression of disaster simulator module simulates severity of disaster, trajectory of disaster, speed and duration of disaster or combinations thereof.

15. The system of claim 10, further including a performance metrics estimator module operable to estimate an evolution of one or more performance metrics resulting from simulation of flow of emergency supplies, dynamics of victims and progression of disaster.

16. The system of claim 15, wherein said one or more performance metrics comprise overall coverage of distribution, inventory of supplies, utilization of resources, demand profile or combinations thereof.

17. A non-transitory program storage device readable by a machine, tangibly embodying a program of instructions executable by the machine to perform a method of estimating effectiveness of a dispensing plan of emergency supplies during disaster events, comprising:

simulating a flow of emergency supplies, including at least a flow of supplies from a source to a plurality of points in a supply chain then to one or more points of distribution, and at each point of the flow, availability of transportation fleet for moving the emergency supplies, transportation route and road conditions;

simulating dynamics of victims, including an arrival pattern and surge of victims at the one or more points of distribution;

simulating progression of disaster, including deteriorating of the road conditions, said steps of simulating including dynamic interactions among flow of emergency supplies, dynamics of victims and progression of disaster, wherein the dynamic interactions comprise at least:

retrieving data associated with when a disaster is launched in an area and how intense the disaster is, that is updated by the simulating of the progression of disaster for use by the simulating of the dynamics of victims, retrieving data associated with activated point of distribution updated by the simulating of the flow of emergency supplies for use by the simulating of the dynamics of victims, wherein the simulating of the dynamics of victims is repeated using the retrieved data associated with when a disaster is launched in an area and how intense the disaster is, and the retrieved data associated with the activated point of distribution, the further simulated dynamics of the victims comprising movement of at least some the victims from one point of distribution to another point of distribution, retrieving data associated with the further simulated dynamics of the victims that is updated by the simulating of the dynamics of victims for use by the simulating of the flow of emergency supplies, wherein the simulating of the flow of emergency supplies is repeated; and determining overall effectiveness of a disaster response plan based on the data output from the dynamic interactions, wherein the overall effectiveness is determined by at least one of:

analyzing a percentile of the victims covered over time, produced by the dynamic interactions, analyzing a size of demand at the one or more points of distribution and how fast the demand is satisfied over time, produced by the dynamic interactions, and analyzing utilization of transportation medium over time, produced by the dynamic interactions.

18. The program storage device of claim 17, wherein the simulating the flow of emergency supplies comprises, simulating multi-echelon supply chain, pre-stocked supply quantity, availability of fleet, transportation route and time, road conditions, and re-stocking policies.

19. The program storage device of claim 17, wherein the simulating dynamics of victims further comprises, simulating number of victims, distribution and dispensing speed, POD activation, level of victim patience in waiting on line for the emergency supplies and switching of PODs for victims.

20. The program storage device of claim 17, wherein the simulating progression of disaster comprises simulating severity of disaster, trajectory of disaster, speed and duration of disaster or combinations thereof.

* * * * *